United States Patent
Kim et al.

(10) Patent No.: US 6,815,320 B2
(45) Date of Patent: Nov. 9, 2004

(54) METHOD FOR FABRICATING SEMICONDUCTOR DEVICE INCLUDING GATE SPACER

(75) Inventors: Sang-su Kim, Suwon (KR); Geum-jong Bae, Suwon (KR); Ki-chul Kim, Suwon (KR); Jung-il Lee, Kimcheon (KR); Hwa-sung Rhee, Kwanak-gu (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/444,221

(22) Filed: May 23, 2003

(65) Prior Publication Data

US 2003/0235966 A1 Dec. 25, 2003

(30) Foreign Application Priority Data

Jun. 22, 2002 (KR) .......................................... 2002-35170

(51) Int. Cl.[7] ................ H01L 21/3205; H01L 21/4763; H01L 21/44
(52) U.S. Cl. ........................ 438/585; 438/595; 438/597
(58) Field of Search ................................ 438/585, 595, 438/597, 618, 639, 778, 535, 275, 301, 303, 305

(56) References Cited

U.S. PATENT DOCUMENTS

| 5,766,991 | A | | 6/1998 | Chen | 438/231 |
|---|---|---|---|---|---|
| 5,783,475 | A | | 7/1998 | Ramaswami | 438/303 |
| 6,150,223 | A | * | 11/2000 | Chern et al. | 438/595 |
| 6,440,875 | B1 | * | 8/2002 | Chan et al. | 438/595 |
| 6,475,888 | B1 | * | 11/2002 | Sohn | 438/535 |
| 6,506,650 | B1 | * | 1/2003 | Yu | 438/595 |
| 6,613,624 | B2 | * | 9/2003 | Wurzer | 438/275 |
| 6,613,637 | B1 | * | 9/2003 | Lee et al. | 438/301 |

* cited by examiner

*Primary Examiner*—John F. Niebling
*Assistant Examiner*—Walter L. Lindsay, Jr.
(74) *Attorney, Agent, or Firm*—Mills & Onello, LLP

(57) ABSTRACT

Provided is a method for fabricating a semiconductor device. According to the method, an insolating layer which defines an active region on a semiconductor substrate is formed and a gate is formed on the active region of the semiconductor substrate. A first spacer layer which covers the gate and is extended to cover the isolating layer is formed as a first insulating material. A second spacer layer is formed on the first spacer layer as a second insulating material. A second spacer which remains on the sidewalls of the gate by removing some portions of the second spacer layer is formed. A first spacer by a portion of the first spacer layer, which is protected by the second spacer by partially etching the exposed portions of the first spacer layer using the second spacer as a mask so as to reduce the thickness of the first spacer layer, and a protection layer, which protects the insulating layer by remaining the portion of the first spacer of which thickness is reduced, are formed. The second spacer is selectively removed and a gate spacer of the first spacer is formed by removing the remaining protection layer.

27 Claims, 5 Drawing Sheets

METHOD FOR FABRICATING SEMICONDUCTOR DEVICE INCLUDING GATE SPACER

BACKGROUND OF THE INVENTION

1. Field of the Invention

The present invention relates to the fabrication of a semiconductor device, and more particularly, to a method for fabricating a semiconductor device including the formation of a spacer on the sidewalls of a gate.

2. Description of the Related Art

A spacer formed around a gate of a complementary metal oxide semiconductor field effect transistor (CMOS FET) is typically used as an implant mask in a self aligned drain and source implantation. In addition, the spacer is used to isolate drain/source electrodes from a gate electrode when the drain/source electrodes are formed through a silicide formation process.

In order to enhance the reliability of functions of the gate spacer and prevent the occurrence of defects in a lower substrate when the spacer is formed, a multi-layered spacer may been introduced and some layers of the spacer may be removed so as to form the spacer in an "L" shape on the sidewalls of the gate. Such a method for fabricating the spacer has been suggested in U.S. Pat. No. 5,783,475 of Shrinath Ramaswami (issued on Jul. 21, 1998).

This method for fabricating the spacer is employed for enhancing the reliability of the distribution of doped impurities in a LDD (lightly doped drain) when drain/source regions are formed of the LDD by self aligned drain and source implantation. Such a method of fabrication has been suggested in U.S. Pat. No. 5,766,991 of The-Yi James Chen (issued on Jun. 16, 1998).

Actually, however, if a spacer having an "L" shape is used in the fabrication of a transistor device such as a field effect transistor (FET), the removal of some layers of the multi-layered spacer is inevitably accompanied by the recessing of an isolating layer.

Figure 1:
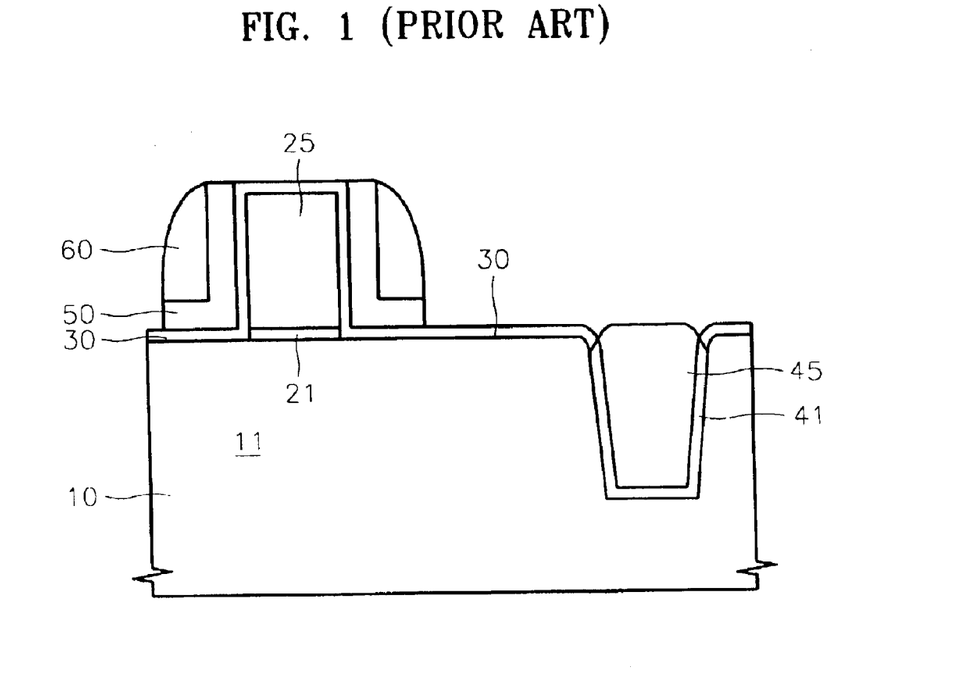
FIGS. 1 and 2 are sectional views illustrating a conventional method for fabricating a gate spacer.
Figure 2:
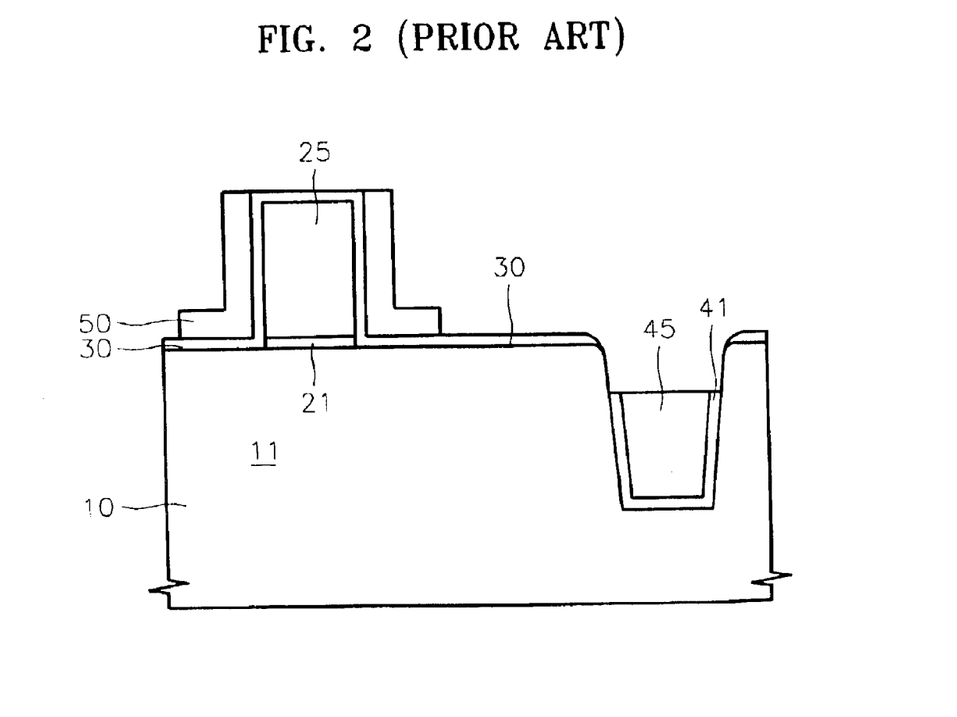

FIGS. 1 and 2 are sectional views for explaining a conventional method for fabricating a spacer.

Referring to FIG. 1, an isolating layer 45 is formed on a semiconductor substrate 10. The isolating layer 45 may be formed through a well-known process such as shallow trench isolation (STI). A buffer layer 41 may be formed as an interface between the isolating layer 45 and the semiconductor substrate 10. A gate dielectric layer 21 is formed on an active region 11 of the semiconductor substrate 10 defined by the isolating layer 45, and a gate 25 is formed on the gate dielectric layer 21.

An "L" shaped first spacer 50 is formed of silicon nitride on both sides of the gate 25, and a second spacer layer 60 is formed of silicon oxide as a disposable spacer on the first spacer 50. An insulating layer 30 composed of silicon oxide may be formed between the gate 25 and the first spacer 50.

Referring to FIG. 2, the second spacer layer 60 is removed after being used as an implant mask during the drain and source region (not shown) implantation process. The isolating layer 45 may also be etched with removal of the second spacer layer 60. According to the conventional method, the second spacer layer 60 is removed through wet etching in which an etchant is provided to the surface of the isolating layer 45 of the shallow trench isolation (STI). Since both the second spacer layer 60 and the isolating layer 45 of the STI are formed of silicon oxide, the isolating layer 45 is unintentionally etched through the wet etching and thus the recess of the isolating layer 45 occurs due to the etching of the isolating layer 45.

If recessing of the isolating layer 45 occurs, the silicide layer (not shown) for the drain/source electrodes may penetrate into a channel region beneath the gate 25. The penetration occurs along the boundary between the channel region and the isolation layers 45, beneath the extended gate 25. The penetration of the silicide layer into the channel region beneath the gate 25 may cause leakage current during the operation of the transistor, wherein a main path of the leakage current is formed along a boundary between the channel region and the isolating layer 45.

Therefore, when a thinner "L" shaped spacer (e.g., the first spacer 50 of FIG. 1) is formed with introducing the disposable spacer (e.g., the second spacer layer 60 of FIG. 1), the prevention of the recess of the isolating layer 45 of the STI becomes the most important task.

SUMMARY OF THE INVENTION

It is an object of the present invention to provide a method for fabricating a spacer that is capable of preventing the recessing of an isolating layer due to wet etch for removing a disposable spacer when a thinner spacer is required to be formed on the sidewalls of a gate by using the disposable spacer.

According to an aspect of the present invention, there is provided a method for fabricating a semiconductor device including a gate spacer. The method includes forming an insolating layer which defines an active region on a semiconductor substrate, forming a gate on the active region of the semiconductor substrate, forming of a first insulating material a first spacer layer which covers the gate and is extended to cover the isolating layer, forming of a second insulating material a second spacer layer on the first spacer layer, forming a second spacer which remains on the sidewalls of the gate by removing some portions of the second spacer layer, forming a first spacer from a portion of the first spacer layer which is protected by the second spacer and a protection layer which protects the insolating layer by allowing a portion of the first spacer having a reduced thickness to remain by partially etching the exposed portions of the first spacer layer using the second spacer as a mask so as to reduce the thickness of the first spacer layer, selectively removing the second spacer and forming a gate spacer which is formed of the first spacer by removing the remaining portion of the protection layer.

In one embodiment, forming the first spacer layer further comprises depositing silicon nitride as the first insulating material. Forming the second spacer layer further comprises depositing silicon oxide as the second insulating material so that the silicon oxide can be selectively etched with respect to the silicon nitride.

In one embodiment, the partial etch for forming the protection layer is a wet etch using phosphoric acid which selectively etches the silicon nitride with respect to the silicon oxide. In one embodiment, the partial etch for forming the protection layer is a dry etch using plasma which is excited by a reactive gas including a fluoric carbon gas, a fluoric hydro carbon gas and an oxygen gas which selectively etch the silicon nitride with respect to the silicon oxide.

Selectively removing the second spacer can be performed by a wet etch using fluoric acid which selectively etches the silicon oxide with respect to the silicon nitride.

Removing the protection layer can be performed by a wet etch using phosphoric acid which etches the silicon nitride forming the protection layer.

In one embodiment, the method further comprises forming an insulating layer composed of silicon oxide beneath the first spacer layer. Forming the insulating layer further comprises growing an oxide layer of thermal oxide on the semiconductor substrate.

Selectively removing the second spacer can include anisotropically etching the second spacer layer so as to expose a portion of the first spacer layer.

In accordance with another aspect, the method for fabricating a semiconductor device of the invention includes forming an insolating layer which defines an active region on a semiconductor substrate, forming a gate on the active region of the semiconductor substrate, forming a first spacer layer which covers the gate and is extended to cover the isolating layer, of a first insulating material, forming a second spacer layer on the first spacer layer of a second insulating material, forming a second spacer which remains on the sidewalls of the gate by removing some portions of the second spacer layer, forming a first spacer by a portion of the first spacer layer which is protected by the second spacer and a protection layer which protects the insolating layer by allowing a portion having a reduced thickness to remain by partially etching the exposed portions of the first spacer layer using the second spacer as a mask so as to reduce the thickness of the first spacer layer, implanting an impurity layer forming drain/source regions with a mask of the second spacer, selectively removing the second spacer, forming a gate spacer which is formed of the first spacer by removing the remaining portion of the protection layer and forming a self aligned silicide layer on the semiconductor substrate exposed by the gate spacer.

Here, the method is characterized in that the impurity layer which is implanted using the second spacer as a mask is an impurity layer having a high density and further comprises implanting an impurity layer having a low density in which the drain and source regions have a lightly doped drain using the gate as a mask. The method is characterized in that the impurity layer which is implanted using the second spacer as a mask is an impurity layer having a high density and further comprises implanting a impurity layer having a low density in which the drain and source regions have a lightly doped drain using the gate spacer as a mask.

According to the present invention, it is possible to prevent the recessing of the isolating layer due to the wet etching for removing the disposable spacer when the thinner spacer is formed on the sidewalls of the gate by using the disposable spacer.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention now will be described more fully with reference to the accompanying drawings, in which preferred embodiments of the invention are shown. This invention may, however, be embodied in many different forms and should not be construed as being limited to the embodiments set forth herein. In the drawings, the thickness of layers and regions are exaggerated for clarity. It will also be understood that a layer is referred to as being "on" another layer or substrate, or intervening layers may also be present.

In preferred embodiments of the present invention, there is provided a method for forming a spacer which makes it possible to prevent the recessing of an isolating layer due to wet etching in removing a disposable spacer when a thinner spacer is formed on the sidewalls of a gate by using the disposable spacer. In addition, there is disclosed a method of removing the disposable spacer while some layers of a spacer formed beneath the disposable spacer for preventing the unintentional recessing of the isolating layer cover the surface of the isolating layer. More detailed descriptions of the present invention will be set forth below with reference to preferred embodiments.

FIGS. 3 through 9 are sectional views illustrating a method for fabricating a semiconductor device including a gate spacer according to embodiments of the present invention.

Figure 3:
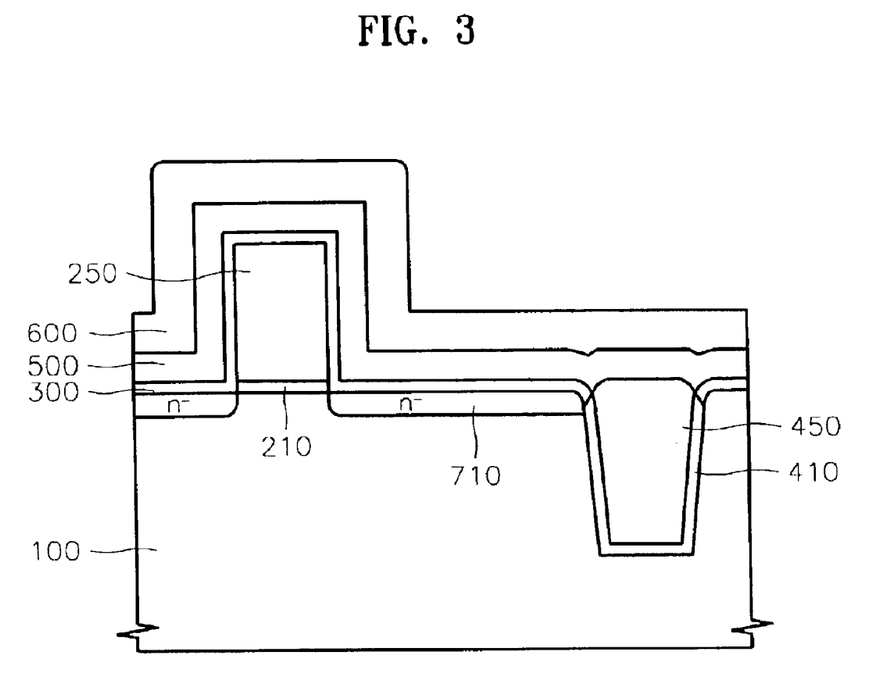
FIGS. 3 through 9 are sectional views illustrating a method for fabricating a semiconductor device including a gate spacer according to embodiments of the present invention.

Referring to FIG. 3, a first spacer layer 500 and a second spacer layer 600 are sequentially formed so as to cover a gate 250. An STI typed isolating layer 450 is formed on a semiconductor substrate 100 through a well-known isolation process. The STI isolating layer 450 may be formed of silicon oxide. A buffer layer 410 may be formed beneath the isolating layer 450 so as to improve interfacial characteristics with the semiconductor substrate 100. The buffer layer 410 may be formed of multiple layers including silicon oxide layer formed by thermal oxidation, a silicon nitride layer, i.e., a $Si_3N_4$ layer, or the like.

A gate 250 of a stack shape, accompanying the gate dielectric layer 210 is formed on the active region of semiconductor substrate 100 defined by the isolating layer 450. The gate 250 may be formed of a conductive material such as conductive polysilicon.

A first spacer layer 500 is formed to cover the gate 250 by a method such as a deposition. The first spacer layer 500 is formed as a gate spacer which covers the sidewalls of the gate 250 in a subsequent process.

Before performing the deposition for forming the first spacer layer 500, a reoxidation process accompanying a thermal process for growing oxide layers on the gate 250 and the semiconductor substrate 100 which is to be exposed by a patterning process of the gate 250 is performed. An insulating layer 300 is formed on the exposed surface of the gate 250 and the semiconductor substrate 100 which are exposed through the reoxidation process. The insulating layer 300 is formed of a thermal oxide grown by the reoxidation process that accompanies the thermal process and thus the thermal oxide is not grown on the surface of the isolating layer 450.

Next, if the drain/source regions of the transistor are composed of a lightly doped drain (LDD), an impurity layer having a low density 710 is formed by implantation. The impurity layer having a low density 710 is an n-type layer in FIG. 3, however, it may be a p-type layer. The gate 250 and isolating layer 450 may be used as the implant mask and the insulating layer 300 may be used as a pad oxide layer during the implantation process.

The thickness of the first spacer 500 may be varied depending on the width of the gate 250 or a design rule of the semiconductor device. The thickness may be about 500 Å to 300 Å for a design rule of 0.25 μm to 0.05 μm. Preferably, the first spacer layer 500 is formed of an insulating material having a distinct etching selectivity with respect to the disposable spacer and the insulating layer 300 formed of the thermal oxide. For example, the first spacer layer 500 may be formed of a silicon nitride $Si_3N_4$. The first spacer layer 500 is formed along the shape of the gate 250 through the deposition process.

The second spacer layer 600 is formed on the first spacer layer 500. The second spacer layer 600 is formed as the disposable spacer. Therefore, it is preferable that the second spacer layer 600 be formed of an insulating material which can be easily removed, that is, an insulating material having a high etching speed and a distinct etching selectivity with respect to the first spacer layer 500. For example, the second spacer layer 600 may be formed of silicon oxide or tetra-ethylorthosilicate (TEOS), by chemical vapor deposition (CVD). The thickness of the second spacer layer 600 may be varied depending on the width of the gate 250 or a design rule of the semiconductor device. The thickness may be about 500 Å to 300 Å for a design rule of 0.25 μm to 0.05 μm.

The first spacer layer 500 and the second spacer layer 600 are deposited on the whole surface of the semiconductor substrate 100 and thus they are extended to cover the surface of the isolating layer 450.

Figure 4:
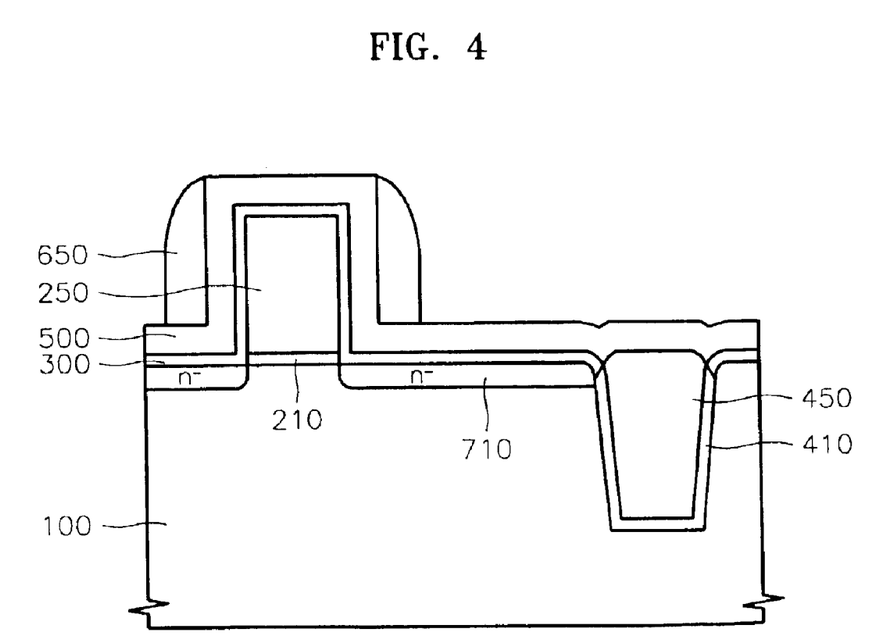

Referring to FIG. 4, a second spacer 650 which will be removed in the subsequent process is formed from the second spacer layer 600 of FIG. 3. The second spacer 650 is formed by dry etching the whole surface of the second spacer layer 600 of FIG. 3 so that the second spacer layer 600 remains only on the sidewalls of the gate 250. It is preferable that the dry etching is anisotropical etching.

Since the second spacer 650 is formed of silicon oxide, it may be etched by reactive ion etching (RIE) using plasma created from a reactive gas including a fluoric carbon gas such as carbon tetrafluoride $CF_4$, a fluoric hydro carbon gas such as trifluoro metan $CHF_3$, and an argon Ar. In order to increase the etch selectivity of the silicon oxide of the first spacer layer 500 to the second spacer 650, the etching is performed in an inert atmosphere including $N_2$ gas. It is preferable that the etching of the silicon oxide be performed with a distinct selectivity with respect to the first spacer layer 500 formed of the silicon oxide.

Since the width of the gate spacer is determined according to the width of the second spacer 650, the second spacer 650 is formed by etching the second spacer layer 600 to a depth required by the semiconductor device. For example, the second spacer 650 may be anisotropically etched so that about 200 Å to 300 Å of the width of the second spacer layer 600 remains.

Figure 5:
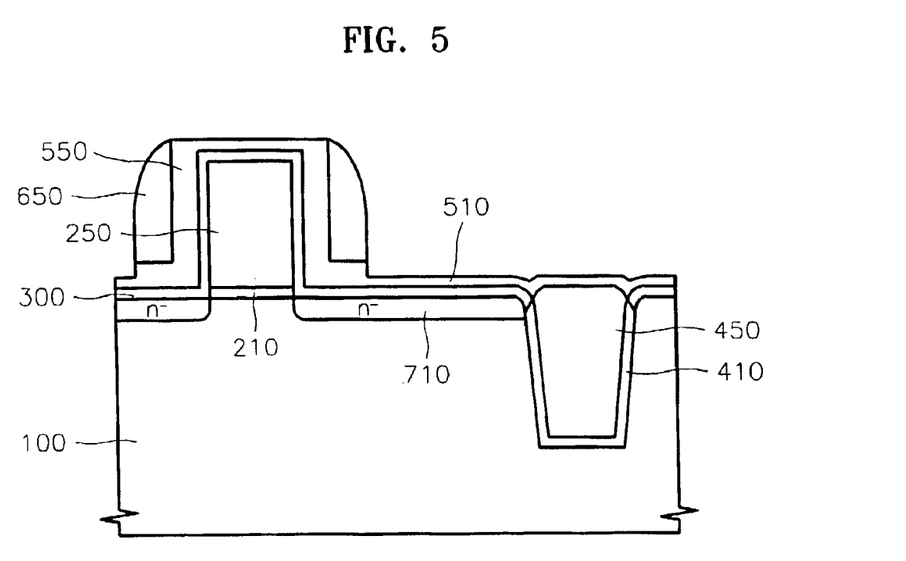

Referring to FIG. 5, the exposed portion of the first spacer layer 500 is partially etched using the second spacer 650 as a mask. The partial etch is performed so as to have a distinct etch selectivity with respect to the material forming the second spacer 650 such as the silicon oxide. For example, the first spacer layer 500 is formed of the silicon nitride and so the exposed portion of the first spacer layer 500 is partially etched by a wet etching using phosphoric acid. Such partial etching is controlled by time and so the thickness remaining after the partial etch may be controlled.

Through the partial etching, a portion of the first spacer layer 500 beneath the second spacer layer 650 is protected and so an "L" shaped first spacer 550 is formed. In addition, the portion remaining after the partial etching extends from the first spacer 550 and thus is formed into a protection layer 510 to protect the isolating layer 450 by covering the isolating layer 450. The protection layer 510 is removed during a subsequent process where the thickness of the first spacer 550 may decrease. Therefore, the thickness of the protection layer 510 is required to be thin enough to maintain a minimum thickness of the first spacer 550 required by the semiconductor device. For example, the thickness of the first spacer 550 is required to be at least 100 Å to 300 Å and thus the remaining thickness of the protection layer 510 should be such that the thickness of the first spacer 550 can be maintained at at least 100 Å to 300 Å.

Also, the partial etch of the exposed portion of the first spacer layer 500 may be a dry etch. For example, it may be an etch by reactive ion etching (RIE) using plasma created from a reactive gas including a fluoric carbon gas such as carbon tetrafluoride $CF_4$, fluoric oxidized carbon gas such as trifluoro metan CHF3, oxygen gas and argon Ar. Here, the silicon nitride forming the first spacer layer 500 may be etched based on its etch selectivity with respect to silicon oxide by controlling the partial pressure of each reactive gas. The oxygen gas may be used as a stopper for preventing the etching of the silicon oxide in the dry etching.

Figure 6:
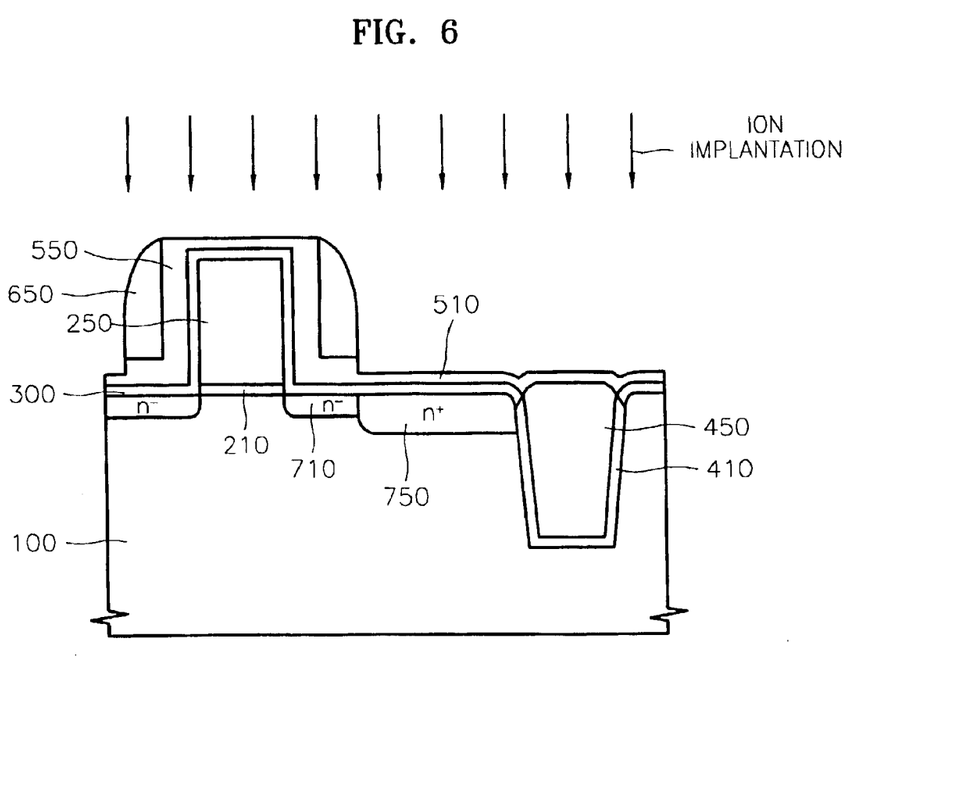

Referring to FIG. 6, an impurity layer having a high density 750 is formed on the semiconductor substrate 100 using of the second spacer 650 and the first spacer 550 as masks. Subsequently, a drain region 710 and a source region 750 which have the LDD structure come to have the impurity layer having a low density 710 and the impurity layer having a high density 750 respectively. The impurity layer having a high density 750 may be formed of a p+ type conductor as well as an n+ type conductor.

Figure 7:
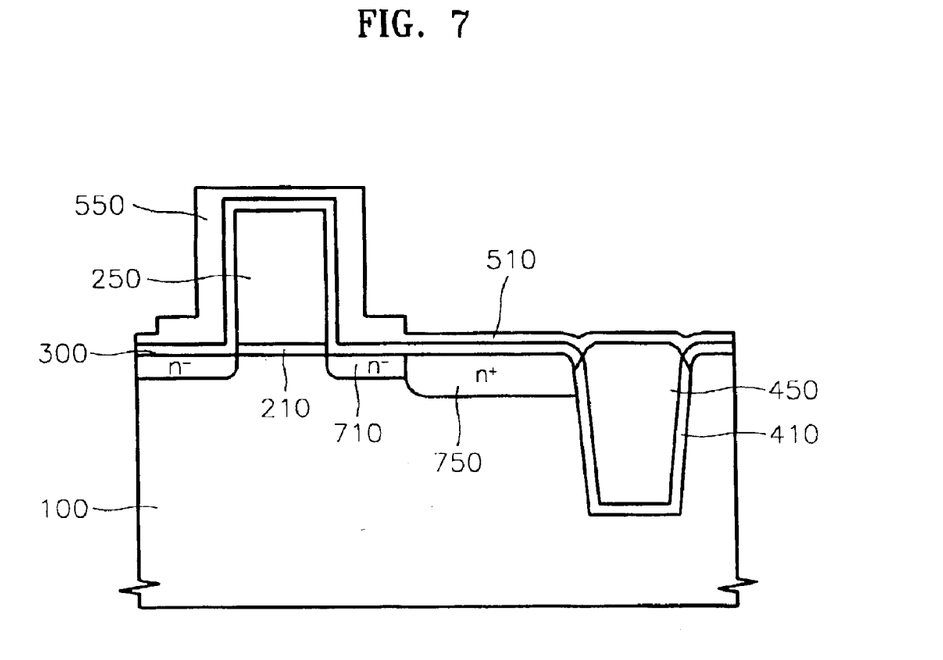

Referring to FIG. 7, the second spacer 650 is selectively removed. Since the second spacer 650 is formed of silicon oxide, it is removed by selectively etching it with respect to the silicon nitride of the protection layer 510 which protects the first spacer 550 and the isolating layer 450. For example, the second spacer 650 may be removed by wet etching using hydrofluoric acid. The hydrofluoric acid may be used after being diluted with water in a ratio of 1 to 100 through 1 to 500.

When such wet etching is performed using fluoric acid, the silicon oxide has a very high selectivity to the silicon nitride and thus the silicon oxide may be selectively removed. Therefore, other portions formed of the silicon oxide on the semiconductor substrate other than the second spacer 650, e.g., the isolating layer 450 formed of STI, may be severely wet etched if they are exposed to the fluoric acid. However, according to the present invention, the isolating layer 450 is protected by the protection layer 510 formed from the first spacer 500 and thus the isolating layer 450 is not affected by the wet etching using the fluoric acid.

Figure 8:
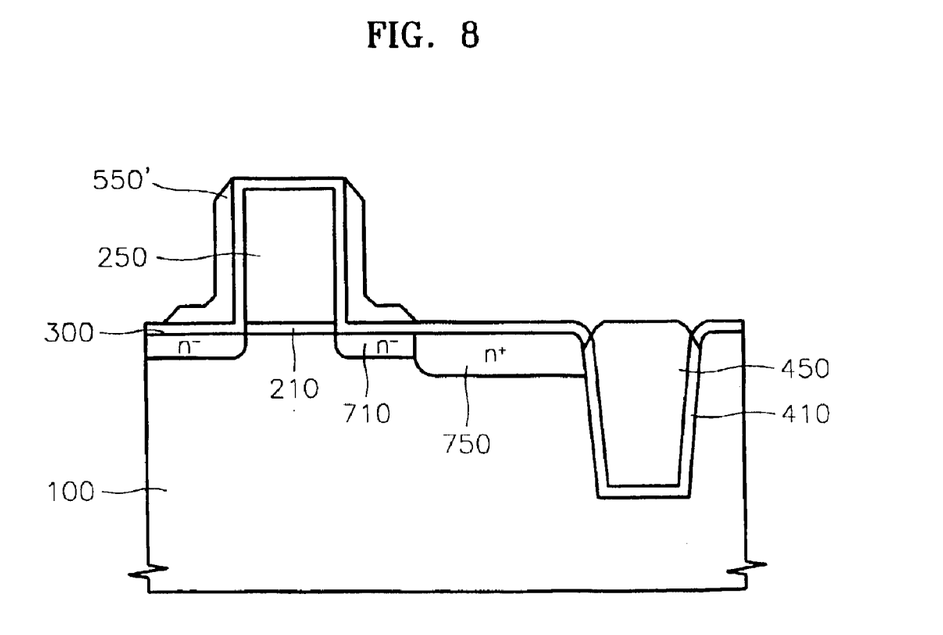

Referring to FIG. 8, a gate spacer 550' is formed by removing the protection layer 510 which extends from the first spacer 550. Such a protection layer 510 and first spacer 550 are formed of silicon nitride and thus it is desirable to remove the protection layer 510 with a distinct selectivity with respect to the insulating layer 300 which is formed of thermal oxide. For example, the protective layer 510 may be fully removed by wet etching with fluoric acid. Through the wet etching, the remained portion of the first spacer layer 500 on the upper portion of the gate 250 is also removed and the thickness of the first spacer 550 may be reduced. However, the thickness of the remained protection layer 510 is predetermined so that the thickness does not exceed the minimum thickness of the gate spacer 550' required by the semiconductor device as explained above and thus the gate spacer 550' can have the appropriate thickness required by the semiconductor device.

By removing the protection layer 510 as described above, the "L" shaped gate spacer 550' is formed on the sidewalls of the gate 250.

Figure 9:
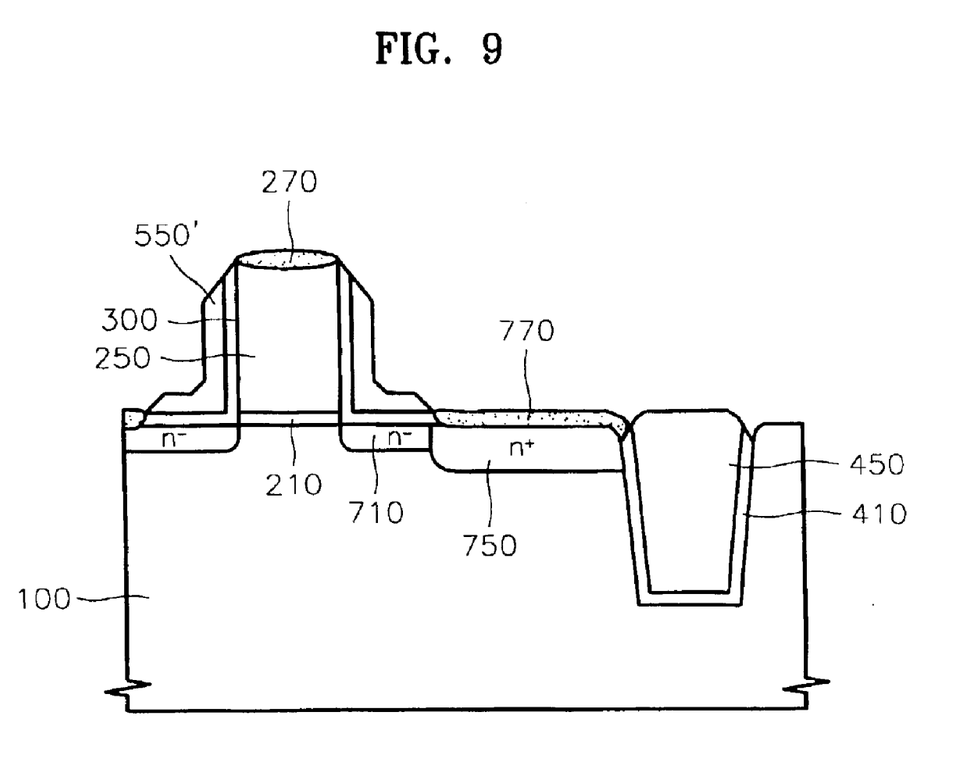

Referring to FIG. 9, a drain/source contact electrode 770 is formed by a silicide process. The insulating layer 300 exposed by the gate spacer 550' is removed by wet etching using fluoric acid so as to expose the surface of the semiconductor substrate 100, on which the impurity layer 750 having a high density forming the drain and the source region 710 is formed. The part of the insulating layer 300 that covers the surface of the gate 250 may be also removed and thus the surface of the upper part of the gate 250 may be exposed. The wet etching using the fluoric acid is performed with a distinct etch selectivity to the semiconductor substrate 100 formed of silicon and is applied to the insulating layer 300 formed of the thermal oxide.

The drain/source contact electrode 770, which is electrically connected to the impurity layer 750 having the high density of the drain and the source region 710 by forming a self aligned silicide process on the exposed semiconductor substrate 100, is formed as a conductive suicide layer. Such conductive silicide layer may be a cobalt (CoSix) silicide layer. If the gate 250 is formed of polysilicon in the silicide process, the cobalt silicide layer may be selectively formed on the surface of the exposed gate 250 to form a gate contact electrode 270.

Here, since the recess of the insulating layer 450 is effectively prevented while the gate spacer 550' of the gate 250 is formed, the penetration and the extension of the silicide layer, i.e., the drain/source contact electrode 770, into the interface of the isolating layer 450 and the channel region of the gate 250 can be prevented. Therefore, the occurrence of the leakage current due to the penetration of the silicide layer can also be prevented.

The method for forming a spacer according to the embodiments of the present invention can be applied to a method for implanting an impurity layer having a low density after implanting an impurity layer having a high density when the drain/source regions having the LDD structure are formed. More specifically, the impurity layer 750 having the high density is implanted as described with reference to FIG. 6, without implanting the impurity layer 710 having the low density using the gate 250 as a mask as described with reference to FIG. 3. After that, the first spacer 650 is removed as described with reference to FIG. 8 and the drain/source structure of the LDD structure may be formed by implanting the impurity layer 710 having the low density using the "L" shaped gate spacer 550' from which the protection layer 510 has been removed as the implant mask.

The method for forming the LDD structure prevents the doped impurities of the impurity layer having the high density from penetrating into the existing impurity layer having the low density during a thermal process for annealing after the implantation. In this method, another impurity layer having a moderate density (not shown) may be interposed between the impurity layers having the high density and the low density.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for fabricating a semiconductor device, the method comprising:
    forming an isolating layer which defines an active region on a semiconductor substrate;
    forming a gate on the active region of the semiconductor substrate;
    forming a first spacer layer of a first insulating material, the first spacer layer covering the gate and extending to cover the isolating layer;
    forming a second spacer layer of a second insulating material on the first spacer layer;
    forming a second spacer which remains on the sidewalls of the gate by removing some portions of the second spacer layer;
    forming a first spacer of the first insulating material from a first portion of the first spacer layer which is protected by the second spacer and a protection layer of the first insulating material which protects the isolating layer by allowing a second portion of the first spacer layer having a reduced thickness to remain by partially etching the second portion of the first spacer layer using the second spacer as a mask so as to reduce the thickness of the second portion of the first spacer layer;
    selectively removing the second spacer; and
    forming a gate spacer which is formed of the first spacer by removing the second portion of the protection layer.

2. The method of claim 1, wherein forming the first spacer layer further comprises depositing silicon nitride as the first insulating material.

3. The method of claim 1, wherein forming the second spacer layer further comprises depositing silicon oxide as the second insulating material so that the silicon oxide can be selectively etched with respect to the silicon nitride.

4. The method of claim 1, wherein the partial etch for forming the protection layer is a wet etch using phosphoric acid which selectively etches the silicon nitride with respect to the silicon oxide.

5. The method of claim 1, wherein the partial etch for forming the protection layer is a dry etch using plasma which is excited by a reactive gas including a fluoric carbon gas, a fluoric hydro carbon gas and an oxygen gas which selectively etch the silicon nitride with respect to the silicon oxide.

6. The method of claim 1, wherein selectively removing the second spacer is performed by a wet etch using fluoric acid which selectively etches the silicon oxide with respect to the silicon nitride.

7. The method of claim 1, wherein removing the protection layer is performed by a wet etch using phosphoric acid which etches the silicon nitride forming the protection layer.

8. The method of claim 1, wherein the method further comprises forming an insulating layer composed of silicon oxide beneath the first spacer layer.

9. The method of claim 8, wherein forming the insulating layer further comprises growing an oxide layer of thermal oxide on the semiconductor substrate.

10. The method of claim 1, wherein selectively removing the second spacer further comprises anisotropically etching the second spacer layer so as to expose a portion of the first spacer layer.

11. The method of claim 1, wherein forming the isolating layer further comprises forming a shallow trench isolation layer on the semiconductor substrate.

12. The method of claim 11, wherein the shallow trench isolation layer is formed of silicon oxide.

13. A method for fabricating a semiconductor device, the method comprising:
- forming an isolating layer which defines an active region on a semiconductor substrate;
- forming a gate on the active region of the semiconductor substrate;
- forming a first spacer layer of a first insulating material, the first spacer layer covering the gate and extending to cover the isolating layer;
- forming a second spacer layer of a second insulating material on the first spacer layer;
- forming a second spacer which remains on the sidewalls of the gate by removing some portions of the second spacer layer;
- forming a first spacer of the first insulating material from a first portion of the first spacer layer which is protected by the second spacer and a protection layer of the first insulating material which protects the isolating layer by allowing a second portion of the first spacer layer having a reduced thickness to remain by partially etching the second portion of the first spacer layer using the second spacer as a mask so as to reduce the thickness of the second portion of the first spacer layer;
- implanting an impurity layer forming drain/source regions with a mask of the second spacer;
- selectively removing the second spacer;
- forming a gate spacer which is formed of the first spacer by removing the second portion of the protection layer; and
- forming a self aligned silicide layer on the semiconductor substrate exposed by the gate spacer.

14. The method of claim 13, wherein forming the first spacer layer further comprises depositing silicon nitride as the first insulating material.

15. The method of claim 13, wherein forming the second spacer layer further comprises depositing silicon oxide as the second insulating material so that the silicon oxide can be selectively etched with respect to the silicon nitride.

16. The method of claim 13, wherein the partial etch for forming the protection layer is a wet etch using phosphoric acid which selectively etches the silicon nitride with respect to the silicon oxide.

17. The method of claim 13, wherein the partial etch for forming the protection layer is a dry etch using plasma which is excited by a reactive gas including a fluoric carbon gas, a fluoric hydro carbon gas and an oxygen gas which selectively etch the silicon nitride with respect to the silicon oxide.

18. The method of claim 13, wherein selectively removing the second spacer is performed by wet etching using fluoric acid which selectively etches the silicon oxide with respect to the silicon nitride.

19. The method of claim 13, wherein removing the protection layer is performed by wet etching using phosphoric acid which etches the silicon nitride forming the protection layer.

20. The method of claim 13, wherein the method further comprises forming an insulating layer composed of silicon oxide beneath the first spacer layer; and removing a portion of the insulating layer which is exposed by removing the protection layer through the gate spacer.

21. The method of claim 20, wherein forming the insulating layer further comprises growing an oxide layer of thermal oxide on the semiconductor substrate.

22. The method of claim 21, wherein removing the insulating layer is characterized by removing the oxide layer grown by the thermal oxide by the wet etching using fluoric acid.

23. The method of claim 13, wherein forming the gate spacer further comprises anisotropically etching the second spacer layer so as to expose a portion of the first spacer layer.

24. The method of claim 13, wherein the method is characterized in that the impurity layer which is implanted using the second spacer as a mask is an impurity layer having a high density and further comprises implanting an impurity layer having a low density in which the drain and source regions have a lightly doped drain using the gate as a mask.

25. The method of claim 13, wherein the method is characterized in that the impurity layer which is implanted using the second spacer as a mask is an impurity layer having a high density and further comprises implanting a impurity layer having a low density in which the drain and source regions have a lightly doped drain using the gate spacer as a mask.

26. The method of claim 13, wherein forming the insulating layer further comprises forming a shallow trench isolation layer on the semiconductor substrate.

27. The method of claim 26, wherein the shallow trench isolation layer is formed of silicon oxide.

* * * * *